US007717227B2

(12) United States Patent
Kusano

(10) Patent No.: US 7,717,227 B2
(45) Date of Patent: May 18, 2010

(54) SPEAKER ATTACHING CONSTRUCTION AND SPEAKER

(75) Inventor: Seiichi Kusano, Yokohama (JP)

(73) Assignee: TWD, Inc., Kanagawa (JP)

( * ) Notice: Subject to any disclaimer, the term of this patent is extended or adjusted under 35 U.S.C. 154(b) by 11 days.

(21) Appl. No.: 10/564,954

(22) PCT Filed: Jul. 27, 2004

(86) PCT No.: PCT/JP2004/011032

§ 371 (c)(1),
(2), (4) Date: Mar. 27, 2007

(87) PCT Pub. No.: WO2005/013640

PCT Pub. Date: Feb. 10, 2005

(65) Prior Publication Data

US 2007/0274803 A1 Nov. 29, 2007

(30) Foreign Application Priority Data

Jul. 31, 2003 (JP) ............................. 2003-283700
Jul. 26, 2004 (JP) ............................. 2004-217134

(51) Int. Cl.
*H05K 5/00* (2006.01)
*H04R 1/02* (2006.01)

(52) U.S. Cl. ....................... 181/150; 181/148; 181/149; 381/386

(58) Field of Classification Search ................. 181/150, 181/148, 149; 381/386
See application file for complete search history.

(56) References Cited

U.S. PATENT DOCUMENTS 1,789,270 A * 1/1931 Boxley ....................... 381/162
2,756,281 A * 7/1956 Pittinger ..................... 381/189
3,045,776 A * 7/1962 Igarashi ...................... 181/171
3,651,545 A * 3/1972 Hara ........................... 24/305
3,767,004 A * 10/1973 Liebscher ................... 181/172
3,938,618 A * 2/1976 Ambruoso, Sr. ............ 181/155
4,169,516 A * 10/1979 Honda ........................ 181/153

(Continued)

FOREIGN PATENT DOCUMENTS

DE 38 17 848 9/1989

(Continued)

OTHER PUBLICATIONS

Supplementary European Search Report mailed Jul. 17, 2006 (3 pages).

*Primary Examiner*—Jeffrey Donels
*Assistant Examiner*—Christina Russell
(74) *Attorney, Agent, or Firm*—Edwards Angell Palmer & Dodge LLP

(57) ABSTRACT

A speaker attaching construction mounted on a plate, including a speaker removably provided with fixtures, having a first engager on one side of an attaching plate and a second engager formed with an engaging piece on the other side of the attaching plate, at a plurality of points by engaging the first engagers with receivers of a frame, through clamping the plate by means of the engaging pieces passed fixing holes of the plate and elastically restored and the attaching plate. This can facilitate the attaching operation and eliminate the stress, resulting from the elastic force, from being applied to the frame. Thus, the speaker can be set up stably.

5 Claims, 5 Drawing Sheets

U.S. PATENT DOCUMENTS

| | | | | | |
|---|---|---|---|---|---|
| 4,179,009 | A | * | 12/1979 | Birkner | 181/171 |
| 4,331,841 | A | * | 5/1982 | Castagna | 381/186 |
| 4,356,881 | A | * | 11/1982 | Lowell | 181/150 |
| 4,422,222 | A | * | 12/1983 | Notoya | 24/614 |
| 4,524,494 | A | * | 6/1985 | Sato et al. | 24/453 |
| 4,681,288 | A | * | 7/1987 | Nakamura | 248/71 |
| D293,880 | S | * | 1/1988 | Takahashi | D8/354 |
| 4,853,966 | A | * | 8/1989 | Skrzycki | 381/395 |
| 4,949,386 | A | * | 8/1990 | Hill | 381/349 |
| 4,993,511 | A | * | 2/1991 | Hiraki et al. | 181/150 |
| 5,306,880 | A | * | 4/1994 | Coziar et al. | 181/149 |
| 5,451,726 | A | * | 9/1995 | Haugum | 181/150 |
| 5,731,554 | A | * | 3/1998 | Anagnos | 181/199 |
| 5,734,131 | A | * | 3/1998 | Sakamoto | 181/141 |
| 5,739,481 | A | * | 4/1998 | Baumhauer et al. | 181/148 |
| 6,128,394 | A | * | 10/2000 | Hayakawa et al. | 381/386 |
| 6,158,869 | A | * | 12/2000 | Barnes, Jr. | 362/86 |
| 6,305,892 | B1 | * | 10/2001 | Qiao | 411/508 |
| 6,457,547 | B2 | * | 10/2002 | Novitschitsch | 181/150 |
| 6,520,704 | B1 | * | 2/2003 | Vidmar et al. | 403/188 |
| 6,606,392 | B2 | * | 8/2003 | Ogawa | 381/386 |
| 6,619,595 | B2 | * | 9/2003 | Hinokio | 248/27.1 |
| 6,626,262 | B1 | * | 9/2003 | Chen | 181/149 |
| 6,675,930 | B2 | * | 1/2004 | Sugiyama et al. | 181/148 |
| 6,744,903 | B1 | * | 6/2004 | Jeon | 381/388 |
| 6,987,860 | B2 | * | 1/2006 | Kurihara et al. | 381/386 |
| 7,325,648 | B2 | * | 2/2008 | Sasaki et al. | 181/150 |
| 2003/0019983 | A1 | * | 1/2003 | Iinuma et al. | 248/200 |
| 2003/0059077 | A1 | * | 3/2003 | Kambe | 381/333 |
| 2004/0037445 | A1 | * | 2/2004 | Kirihara et al. | 381/389 |
| 2004/0184629 | A1 | * | 9/2004 | Maruta | 381/306 |
| 2004/0264710 | A1 | * | 12/2004 | Maekawa et al. | 381/86 |
| 2005/0091739 | A1 | * | 5/2005 | Lerma | 4/541.1 |
| 2006/0198546 | A1 | * | 9/2006 | Sasaki et al. | 381/391 |
| 2007/0154054 | A1 | * | 7/2007 | Hayasaka et al. | 381/386 |
| 2007/0230738 | A1 | * | 10/2007 | Royse | 381/433 |

FOREIGN PATENT DOCUMENTS

| | | | | |
|---|---|---|---|---|
| GB | 2 349 037 | | | 10/2000 |
| GB | 2349037 | A | * | 10/2000 |
| JP | 64-39156 | | | 3/1989 |
| JP | 39156/1989 | | | 3/1989 |
| JP | 3-8485 | | | 1/1991 |
| JP | 8485/1991 | | | 1/1991 |
| JP | 04034091 | A | * | 2/1992 |
| JP | 04-034091 | | * | 3/1992 |
| JP | 4-34091 | | | 3/1992 |
| JP | 34091/1992 | | | 3/1992 |
| JP | H04-34091 | | * | 3/1992 |
| JP | H04-34091 | U | * | 3/1992 |
| JP | 7-9504 | | | 3/1995 |
| JP | 7-251686 | | | 10/1995 |
| JP | 2001-352590 | | | 12/2001 |

* cited by examiner (a)

(b)

SPEAKER ATTACHING CONSTRUCTION AND SPEAKER

BACKGROUND OF THE INVENTION

1. Field of the Invention

The present invention relates to a speaker attaching construction and speaker that a speaker is mounted on an attaching plate by the utilization of an elastic deformation and restoration of an engaging piece.

2. Description of the Related Art

Conventionally, it is a general practice to use an attaching construction shown in FIGS. 6 and 7 as a structure to mount a speaker on a plate. In FIGS. 6 and 7, 1 is a speaker, 2 is a frame generally circumferential in form, and 3 is a cone-formed vibration plate having a resilient hook (edge) at nearly an upper end. The frame 2 has an upper plate 2*a* having an upper surface bonded, by abutment, with an underside of a top plate 3*a* of the vibration plate 3, thus fixing the vibration plate 3 on the frame 2 at the inner portion thereof. The frame 2 has a lower plate 2*b* having an underside arranged, by abutment, on the upper surface of a plate 4. A screw 5 at its thread 5*a* is screwed in a screw hole 2*c* formed in the lower plate 2*b*.

In the FIG. 6 attaching construction, a fixing hole 4*a* is formed by screwing in the plate 4 a thread 5*a* of a screw 5, such as a tapping screw, being screwed in the screw hole 2*c*, thereby firmly fixing the frame 2 and the plate 4 together by screwing at three to four points. Meanwhile, in the FIG. 7 attaching construction, the screw 5 screwed in the screw hole 2*c* is screwed in the fixing hole 4*b* formed in a position corresponding to the screw hole 2*c*. A nut 6, e.g., U-formed speed nut, is screwed from the tip of the thread 5*a* projecting downward of the fixing hole 4*b*, thereby tightening the frame 2 lower plate 2*b* and the plate 4 together at three to four points.

However, in the speaker attaching construction in FIG. 6 or 7, troublesome operation is required in tightening, one by one, the screw 5 by means of a screwdriver while holding the speaker 1 during attaching operation. Furthermore, the FIG. 7 attaching construction requires an operation of tightening the nut 6 at back of the plate 4 in addition to the operation to tighten the screw 5 at front of the plate 4.

Consequently, there is a proposal, in Patent Document 1 (JP-A-2001-352590), of an attaching construction in which fixing is facilitated by the utilization of elastic deformation and restoration of an engaging piece. The attaching construction in Patent Document 1 is a speaker mounting structure in which the frame is fixed to a plate by engaging in a fixing hole formed in the plate the engaging hook and clip formed in the frame. By engaging, in the plate fixing hole, the engaging hook, downwardly bent in the left and right lower portion of the frame, the engaging clip, at its slant guide, is elastically deformed by abutting against the upper edge of the fixing hole. Elastically restored by passing of the slant guide through the fixing hole, the engaging clip at its U-formed engager engages with the upper edge of the fixing hole. Furthermore, the engaging hook and the engaging clip are arranged inner than the outer edge of an annular seal member bonded to the frame mounting surface and closely contacted with the plate, thereby blocking the water intruding at an opening or fixing hole of the plate by the seal member and preventing it from flowing toward the vehicular compartment.

Similarly, Patent document 2 (JP-B-7-9504) discloses a structure in which a frame is projected with an insert-engager at one end and an insert-receiver at the other end thereof, so that an engaging fixture is inserted in the insert-receiver to hold it by a clamp piece and fit and fix a projection of the engaging fixture in a fit hole of the insert-receiver, whereby the frame insert-receiver is inserted in a plate insert hole and the engaging fixture is inserted in the insert hole into an engagement thereof with an edge of the insert hole, wherein the engager, when inserted in the insert hole, is narrowed and the engager, when passed, is elastically restored.

Besides, Patent Document 3 (JP-A-4-34091) discloses an attaching construction eliminating the need for tightening the nut at back of the plate. By using a cylindrical fixing tool having a polygonal engaging piece at one end and a screw hole at the other end and in a sheet form bendable circumferentially between a screw hole and an engaging piece and having a plurality of clamp pieces generally L-shaped in form, the fixing tool is inserted in a insert-hole in the plate. By engaging the engaging piece with an engaging groove corresponding to the engaging piece form of the speaker main body, rotation is restricted. Further, a fixing bolt is screwed to the fixing tool, and projected circumferentially while bending a center region of the clamping piece, thereby attaching the speaker main body to the plate.

SUMMARY OF THE INVENTION

In the attaching construction of Patent Document 1, 2 utilizing an elastic deformation and restoration of the engaging piece, the engaging hook or insert-engager provided at one side of the frame is caught in the fixing hole so that the frame is stably mounted on the attaching plate by an elastic deformation and restoration of the engaging piece serving as an engager of an engaging clip or fixture provided at the other side of the frame. After setting up the frame, the engager remains in a state of being elastically deformed to a certain extent. The stress, resulting from the elastic force, is applied to the frame at all times. This results in a fracture at a stress-concentrated point in the frame, thereby resulting in lower durability. Furthermore, whenever the fixing hole is different in form or size in the attaching plate or whenever the attaching plate has a different thickness, the engager of the frame cannot be engaged, thus resulting in a disadvantage of inferior versatility.

The present invention, proposed in view of the problem, aims at providing a speaker attaching construction and speaker in which a fixing operation can be facilitated by utilization of an elastic deformation and restoration of an engaging piece and, furthermore, stable setup of the speaker is available by eliminating the application of the stress due to an elastic force to the frame, thus improving durability in the frame or the fixing parts. Another object is to provide a speaker attaching structure and speaker excellent in versatility that can cope with the cases whenever the fixing hole is different in form or size or whenever the attaching plate has a different thickness.

A speaker attaching construction of the present invention mounts, on an attaching plate, a speaker removably provided with fixtures, having a first engager on one side of the attaching plate and a second engager formed with an engaging piece on the other side of the attaching plate, at a plurality of points by engaging the engagers with receivers of a speaker frame, through clamping the attaching plate and an adapter or the attaching plate by means of the engaging pieces passing through the fixed hole of the attaching plate and elastically restored and the attaching plate or the speaker frame.

Meanwhile, a speaker attaching construction of the present invention mounts, on an attaching plate, a speaker removably provided with fixtures, having a first engager on one side of the attaching plate and a second engager formed with an engaging piece on the other side of the attaching plate, at a plurality of points by engaging the engagers with receivers of a speaker frame, through engaging the engaging pieces passing through holes of the attaching plate and being elastically restored, at least one of the fixing points being arranged close to a lower end of the speaker frame, whereby water intruding between the speaker frame and the attaching plate drains outward of the attaching plate through an internal space of the fixture close to the lower end. The fixing point is taken, say, at one or a plurality of points nearby the lower end immediately beneath the center of a circular frame.

Meanwhile, a speaker of the present invention is removably provided with fixtures, having a first engager on one side of an attaching plate and a second engager formed with an engaging piece on the other side of the attaching plate, at a plurality of points by engaging the engagers with receivers of a speaker frame, the engaging piece being deformed inward as inserted in a fixing hole of the attaching plate and elastically restored after passing through the fixed hole, to clamp the attaching plate and an adapter or the attaching plate by means of the elastically restored engaging piece and the attaching plate or the speaker frame. The fixture is suitably secured to a speaker frame by tightening a screw in a screw hole formed in one of the engagers.

In the speaker attaching construction and speaker of the invention, there are provided, on a speaker, fixtures having engaging pieces to elastically deform and restore. With the utilization of an elastic deformation and restoration of the engaging pieces, the speaker can be fixed by merely inserting the engaging pieces in fixing holes of the attaching plate. Thus, the speaker can be easily fixed. For example, fixing operation is easy even in a narrow space, e.g. attaching a speaker to an automotive doorplate.

Furthermore, fixing is accomplished by clamping the attaching plate, etc. by the engaging pieces, attaching plates, etc., of fixtures provided at a plurality of points, wherein fixing is accomplished in the state of the engaging pieces being elastically restored. This eliminates the application, to the frame, of stress resulting from an elastic force. Thus, the speaker can be stably set up wherein durability is improved in the frame and fixing parts.

Meanwhile, by removably providing fixtures, e.g., by preparing a plurality of kinds of fixtures, handling is possible even in the case where the fixing hole is different in form or size. Furthermore, by suitably using fixtures that are different in dimension between the attaching plate and the engaging piece for example, it is easy to cope with a plate having a different thickness, thus providing excellent versatility.

Meanwhile, by arranging at least one of fixing points of fixtures at a position nearby the lower end of the speaker frame, water intruding between the speaker frame and the attaching plate can be drained outward of the plate through an internal space of the fixture nearby the lower end. This can enhance the effects of water-draining and waterproofing, e.g., thereby preventing water from intruding in a vehicular compartment.

DETAILED DESCRIPTION OF EXEMPLARY EMBODIMENTS

Based on FIGS. 1 to 4, explanation is made on an exemplary embodiment of a speaker attaching construction in the present invention.

Figure 1:
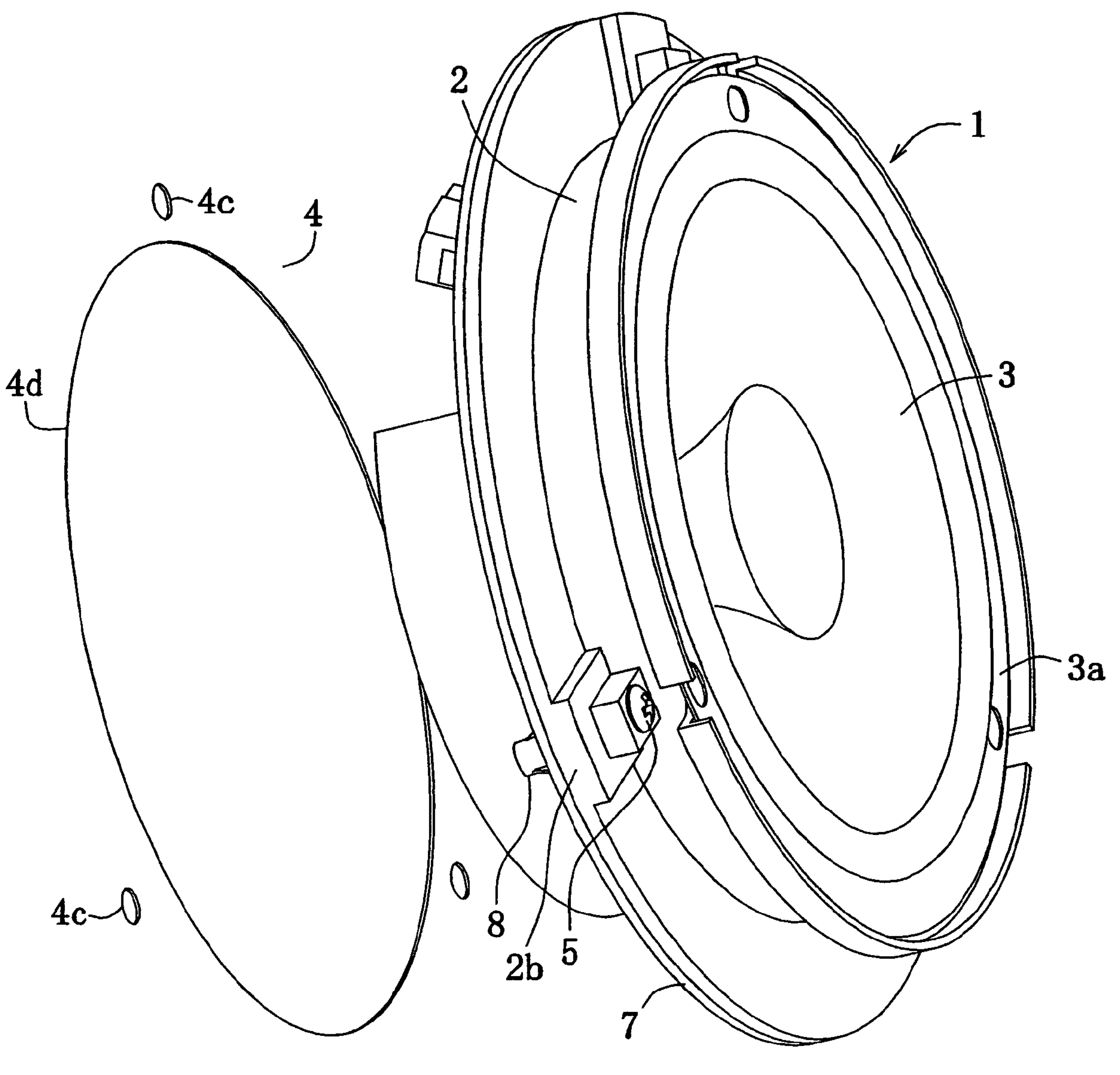
FIG. 1 is a perspective view showing a state before mounting a speaker in an embodiment to a plate.
Figure 2:
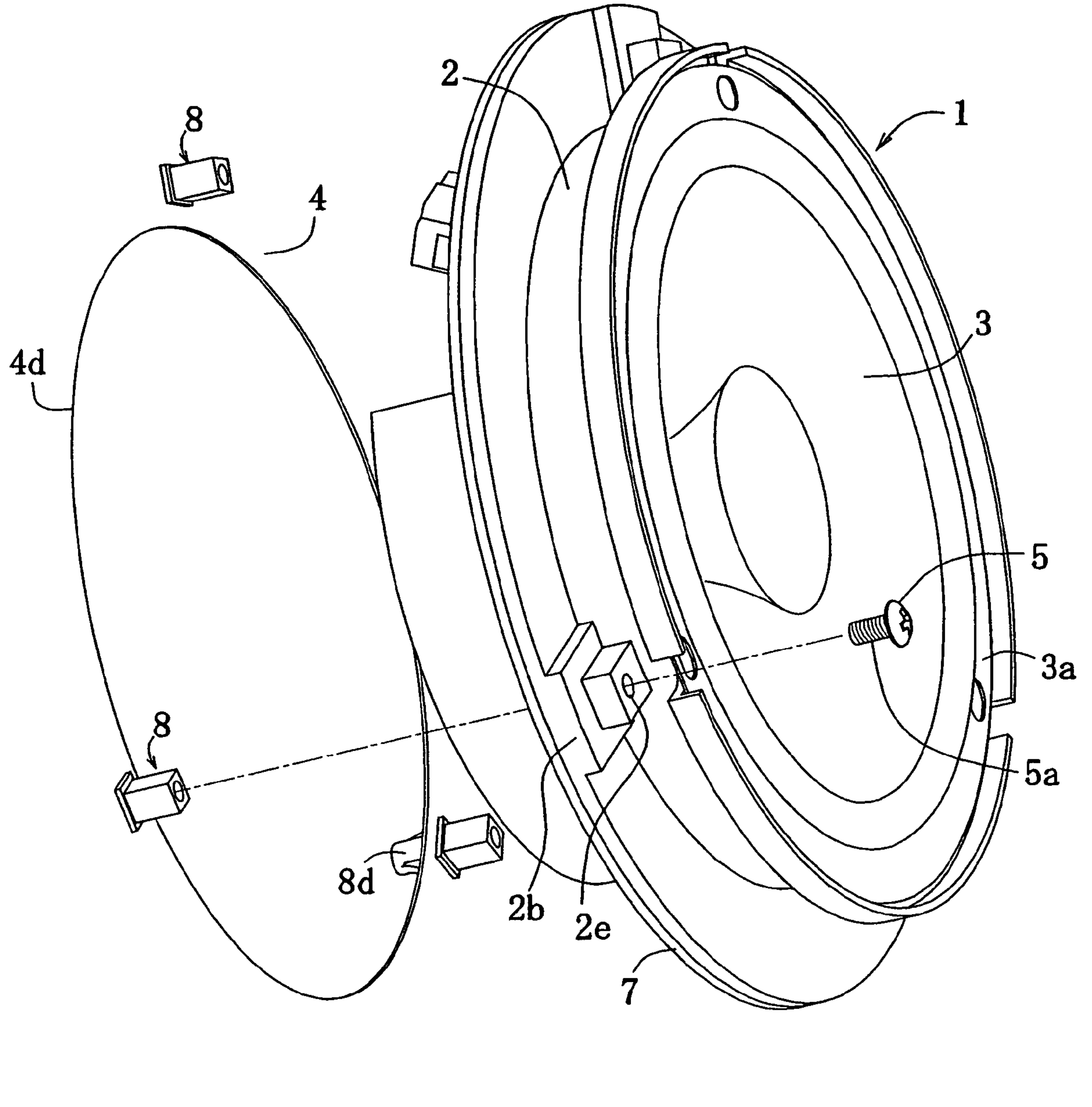
FIG. 2 is an explanatory perspective view showing a state in which fixtures and screws are disassembled in FIG. 1 to thereby engage the fixtures in fixing holes.
Figure 3:
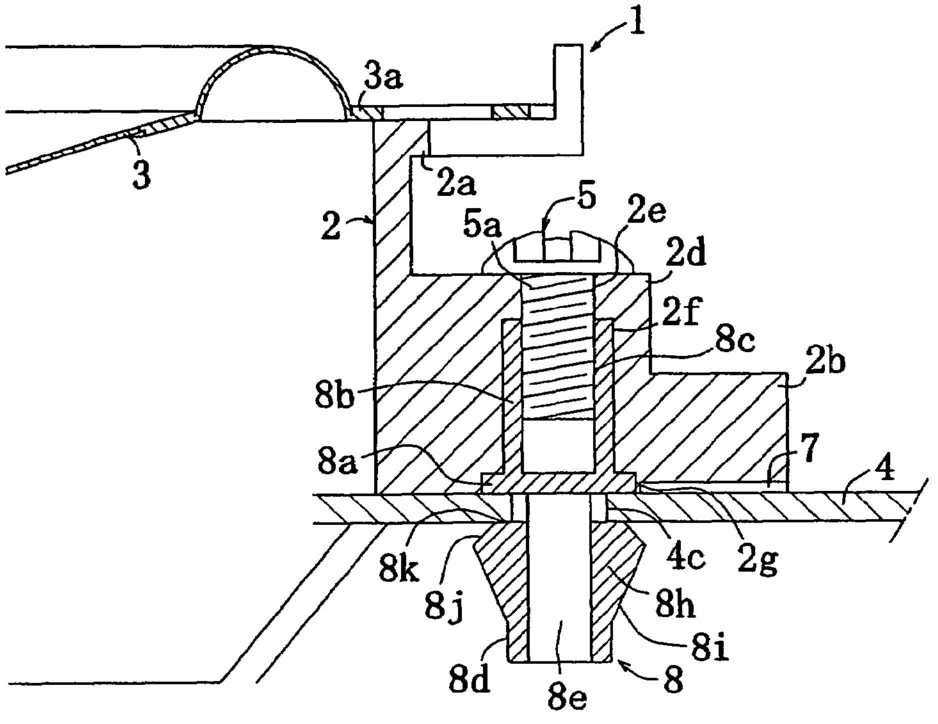
FIG. 3 is a fragmentary vertical sectional view showing a fixing region with a fixture.

A speaker 1 in this embodiment has a vibration plate 3, in a cone form having a resilient hook (edge) at generally an upper end thereof, fixed inside a metal frame 2 in generally a circumferential form, as shown in FIGS. 1 to 3. The frame 2 has an upper plate 2*a* having an upper surface bonded, by abutment, with a lower surface of a top plate 3*a* of the vibration plate 3. Incidentally, although not shown, an adapter generally circumferential in form, such as a urethane cushion, is provided by adhesion on the upper surface of the top plate 3*a* of the vibration plate 3 provided on the upper plate 2*a* of the frame 2.

The frame 2 has a lower plate 2*b* provided with a thick-walled step 2*d* in an inner portion thereof. The step 2*d* is formed with an insert-hole 2*e* for a screw 5. Near a center of the insert-hole 2*e*, there is formed a first receiver 2*f* that is a hole square in cross-section wherein the square has a width/depth length greater than a diameter of the insert-hole 2*e*. In a lower end of the insertion-hole 2*e*, there is recessed a second receiver 2*g* that is square in form greater in width/depth length than the square of the first receiver 2*f*. Furthermore, a cutout is formed along an outer peripheral edge in the lower plate 2*b* of the frame 2 in a lower-surface outer portion thereof. In the cutout, a circumferential, waterproofing seal material 7 is arranged along the outer peripheral edge. Incidentally, the seal material 7 functions as an anti-resonant plate for attaching plate 4. Meanwhile, because the insert-hole 2*e* and the receivers 2*f*, 2*g* are provided inside the seal material 7 in the outer peripheral edge, water can be prevented from intruding to the outer of the speaker through those points.

The lower plate 2*b* of the frame 2, at its underside, is arranged so as to abut against the upper surface of the attaching plate 4. The frame 2 and the attaching plate 4 are arranged such that the insert-hole 2*e*, first and second receivers 2*f*, 2*g* of the frame 2 corresponds in position to a fixing hole 4*c* of the attaching plate 4. The first receiver 2*f* is formed in such a shape and size so as to engage a first engager 8*b* of a fixture 8, referred to later, while the second receiver 2*g* is formed in such a shape and size so as to engage an engaging plate 8*a* of the fixture 8, referred to later.

Figure 4:
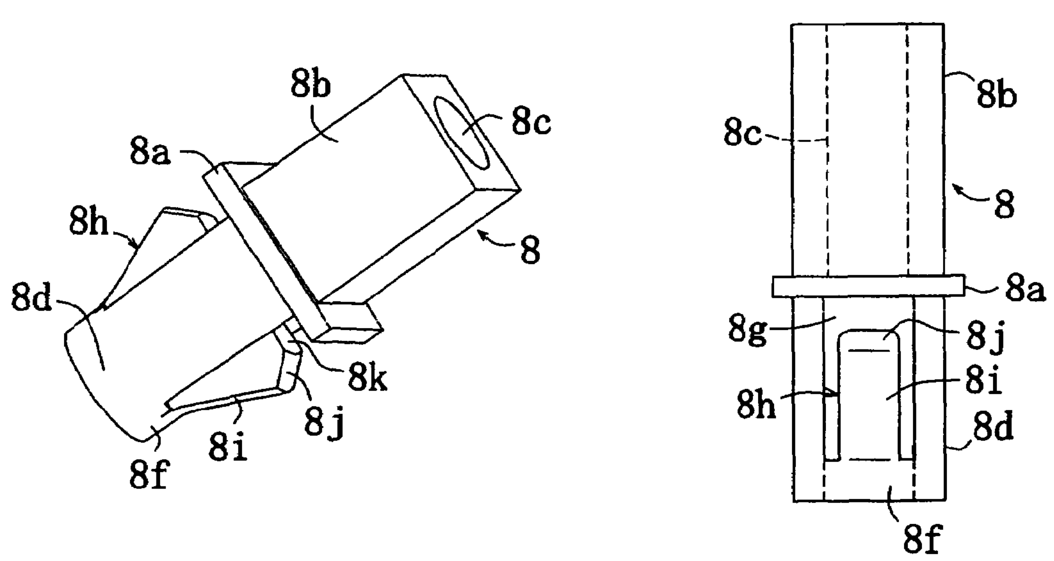
FIGS. 4(*a*), (*b*) are perspective and side views, respectively, showing a fixture.

Meanwhile, the fixture 8, formed of resin, such as ABS resin or nylon resin, has a rectangular-parallelepiped first engager 8*b* in a position above the square engaging plate 8*a*, as shown in FIGS. 3 and 4. Inside the first engager 8*b*, there is vertically formed a screw hole 3*c* in which is to be screwed a thread 5*a* of the screw 5, e.g., a tapping screw. Below the engaging plate 8*a*, there is vertically formed a hollow 8*e* rectangular in cross-section within a second engager 8*d*. In both sides of the second engager 8*d*, square cutouts 8*g* are respectively formed extending from the engaging plate 8*a* to lower-end bridges 8*f*. Furthermore, in the upper ends of the both bridges 8*f*, there are respectively formed fan-like engaging pieces 8*h* in a manner spreading laterally in an upward direction. The engaging piece 8*h*, arranged in the cutout 8*g* as viewed from the side, has a first slant portion 8*i* that is slanted in a manner spreading upwardly, a second slant portion 8*j* that is slanted in a manner reducing upwardly, and a top end face 8*k* extending horizontally from a top end of the second slant portion 8*j*.

The first engager 8*b* of the fixture 8 is inserted and engaged in the first receiver 2*f* of the frame 2 while the engaging plate 8*a* of the fixture 8 is inserted and engaged in the second receiver 2*g*. The screw 5, to be inserted into the insert-hole 2*e* from the top surface of the step 2*d*, at its thread 5*a*, is screwed into the screw hole 8*c* of the fixture 8. By tightening the screw 5, the frame 2 and the fixture 8 are secured in the engagement state. Furthermore, the fixture 8 at its second engager 8*d* is externally inserted in the fixing hole 4*c* of the attaching plate 4. The plate 4 is fitted between the underside of an engaging plate 8*a* peripheral protrusion and the upper end face 8*k* of the engaging piece 8*h*. The fixture 8 is engaged with and fixed on the attaching plate 4.

The speaker 1 is rendered in a state that the fixture 8 is previously integrated with the frame 2 by screwing with a screw 5, as shown in FIG. 1. When fixing the speaker 1 to the attaching plate 4, fixtures 8 are arranged in positions of fixed holes 4*c* in the attaching plate 4. While the speaker 1 at its lower portion is inserted in the mount hole 4*d* of the attaching plate 4, the second engagers 8*d* at their tips are inserted in the fixed holes 4*c*. The fixing hole 4*c* is circular, so as to have a diameter formed nearly equal to or somewhat smaller than the outer diameter of a circular region of the second engager 8*d*. As the insertion proceeds, the wing-like engaging piece 8*h* at its first slant portion 8*i* goes into abutment against an outer edge of the fixed hole 4*c*. By the outer edge of the fixed hole 4*c*, the outward protrusion of the engaging piece 8*h* is pushed in the hollow 8*e* and hence, the engaging piece 8*h* is deformed elastically.

Thereafter, when the first slant portion 8*i* at its outer end passes the fixed hole 4*c*, the engaging piece 8*h* goes into elastic restoration. By means of the elastic force of the engaging piece 8*h*, the engaging piece 8*h* passes through the inner side of the fixed hole 4*c* while putting the second slant portion 8*j* along the outer edge of the fixed hole 4*c*. When completely passed through fixing hole 4*c*, the engaging piece 8*h* is elastically restored completely. Simultaneously, the attaching plate 4 is fixedly clamped between the upper end face 8*k* of the engaging piece 8*h* and the underside of the engaging plate 8*a*. Thus, the fixtures 8 and the speaker 1 fixed with the fixtures 8 are engaged and stably fixed on the attaching plate 4.

The dimension, between the upper end face 8*k* of the engaging piece 8*h* and the underside of the engaging plate 8*a*, is provided, say, correspondingly to a thickness of the attaching plate 4. The attaching plate 4, even if different in thickness, can be easily coped with by using fixtures 8 such that the dimension of between the upper end face 8*k* of the engaging piece 8*h* and the underside of the engaging plate 8*a* corresponds to the thickness of the attaching plate 4. Meanwhile, in the state in which the speaker 1 is attached, the engaging pieces 8*h* are elastically restored by the fixtures 8 provided in a plurality of points. The frame 2 and the fixtures 8 are free from the stresses imposed by an elastic force.

Thereafter, in the case of removing the speaker 1 out of the attaching plate 4, the screws 5 are loosened and removed to withdraw the frame 2 out of the inserted fixtures 8, thus removing the speaker 1. The fixtures 8 in a state left on the attaching plate 4 can be removed by inserting the hand through the mount hole 4*d* and pushing toward the front while pushing the engaging pieces 8*h* at the both sides into the hollow 8*e*. Accordingly, removal operation is easy to perform. By inserting the removed fixtures 8 again in the frame 2, the speaker 1 can be easily fixed again on the attaching plate 4.

Figure 5:
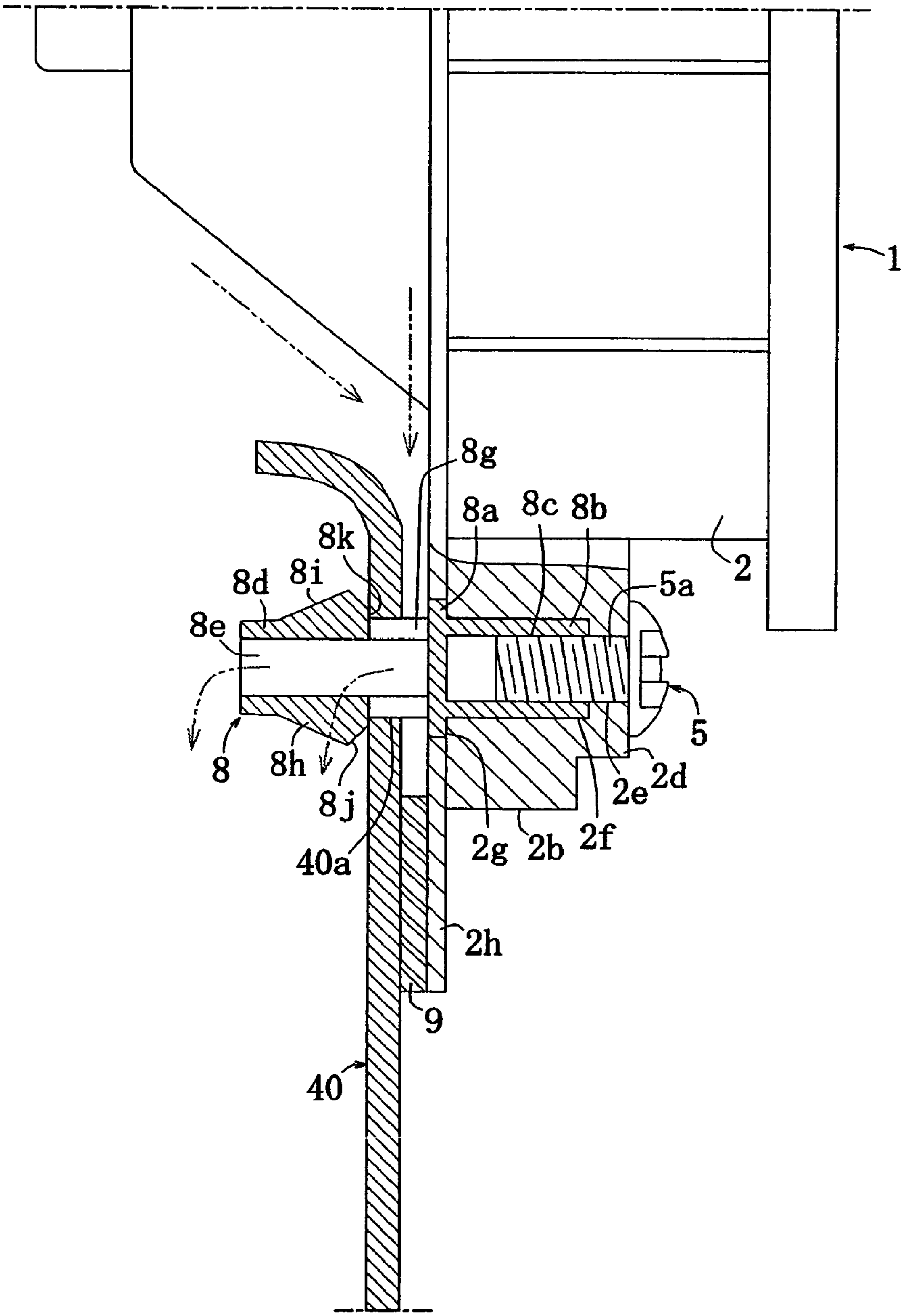
FIG. 5 is an explanatory fragmentary vertical sectional view showing a fixing region with another fixture.
Figure 6:
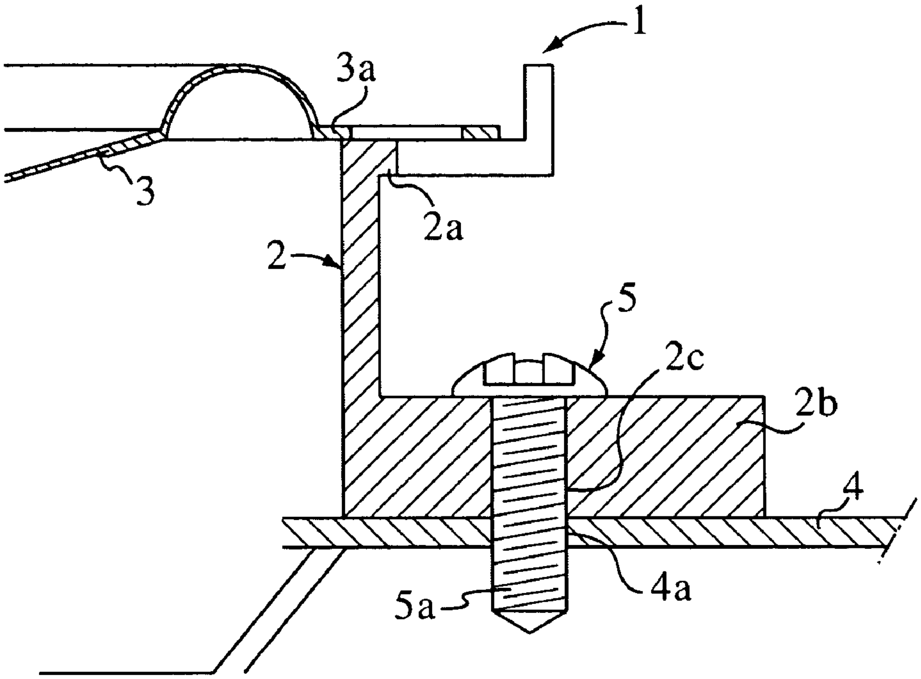
Fig.6 PRIOR ART
FIG. 6 is a fragmentary vertical sectional view showing a fixing region in a first example of the conventional speaker attaching construction.
Figure 7:
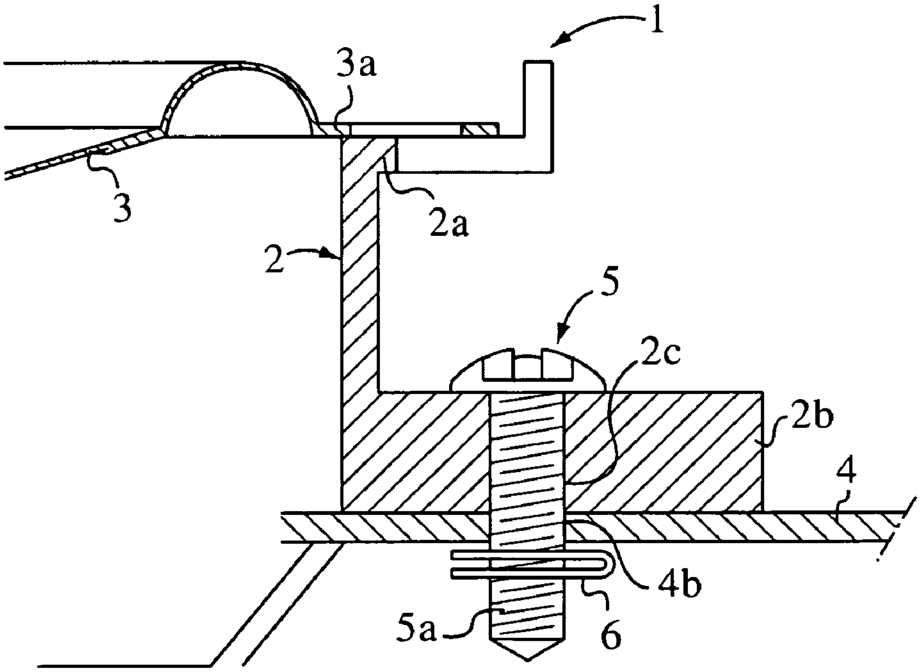
Fig.7 PRIOR ART
FIG. 7 is a fragmentary vertical sectional view showing a fixing region in a second example of the conventional speaker attaching construction.

Next, explanation is made of a speaker attaching construction in another embodiment, based on FIG. 5. Incidentally, the structure not especially referred to in this embodiment is basically similar to the speaker 1 in the embodiment and the construction of attaching the same.

In the speaker 1 of this embodiment, there is internally provided a cone-formed vibration plate 3, not shown, in a generally circumferential frame 2 wherein, in an insert-hole 2*e* in a step 2*d* of a frame 2, there is formed a first receiver 2*f* that is a hole square in cross-section having a square width/depth length greater than a diameter of the insert-hole 2*e*. Furthermore, on the underside of a lower plate 2*b* of the frame 2, there is secured a fixed plate 2*h* in a plate-circumferential form. In a corresponding point of the fixed plate 2*h* to the insert-hole 2*e*, there is formed a square hole greater in length than the square of the first receiver 2*f*. The hole is provided as a second receiver 2*g*. Along the periphery of and on the outer surface of the fixed plate 2*h*, there is firmly fixed an adapter 9 in a plate-circumferential form, e.g., a urethane sponge cushion having a waterproofing and vibration-preventing function.

Meanwhile, the fixture in this embodiment is formed longer in the distance between the underside or outer surface of the engaging plate 8*a* and the upper end face 8*k* of the engaging piece 8*h*, than the fixture 8. The engaging plate 8*a* is inserted in and engaged with the second receiver 2*g* of the fixed plate 2*h* while the first engager 8*b* is inserted in and engaged with the first receiver 2*f* of the frame 2. The screw 5, to be inserted in the insert-hole 2*e*, at its thread 5*a* is screwed into the screw hole 8*c* of the fixture 8. By tightening the screws 5, the frame 2 and the fixtures 8 are firmly fixed in the engagement state.

The attaching construction in FIG. 5 provides a correspondence between the second receiver 2*g*, first receiver 2*f* and insert-hole 2*e* of the fixed plate 2*h* and the mount hole 40*a* of the vehicular door panel 40. By abutting the outer surface of the adapter 9 against the door panel 40, the frame 2 is arranged. By inserting the engager 8*d* of the fixture 8 in the mount hole 40*a* of the door panel 40 in a direction of from inside to outside, the fixture 8 is engaged in the door panel 40 due to an elastic deformation and restoration of the engaging piece 8*h* similarly to the foregoing embodiment, thereby arranging the speaker 1 facing the inward of the door panel 40. In this embodiment, there is formed a space between the outer surface of the fixed plate 2*h* and the door panel 40 in the attaching state, providing a circumference hermetically closed by the interposing adapter 9.

Furthermore, among the three fixing points (see FIGS. 1 and 2) in the frame 2 and door panel 40 due to the fixtures 8, the fixing point with the FIG. 5 fixture 8 is provided in a position close to the lowermost end lying immediately below a circular center, in front view, of the speaker 1. With the structure, the water at around the speaker 1 or the water on the speaker 1 can be drained to the outside of the door panel 40 through the fixture 8 hollow 8*e* or the like, as shown by the two-dot-chain line in the figure. Thus, it is possible to prevent or suppress the gathering of an adapter 9 water lying in a position between the door panel 40 and the fixing plate 2*h* at an outer of the fixture 8. With the excellent draining function of the fixture 8 and the waterproofing function of the adapter 9, water is prevented from intruding in a vehicle compartment, thus providing a high waterproofing effect.

INDUSTRIAL APPLICABILITY

The speaker attaching construction and speaker of the invention is suitable if used, say, where a speaker is fixed on a speaker-mounting plate to be provided in an automobile. Besides, it can be used where a speaker is fixed on a plate to be provided in a proper location.

The invention claimed is:

1. A speaker construction, comprising:

an attaching plate; and a speaker assembly to be mounted on said attaching plate, wherein said speaker assembly comprises:

- a speaker removably provided with a plurality of fixtures at a plurality of fixing points mounted on a speaker frame, each said fixture including:
- first and second engagers arranged on opposite sides of engaging plate, a screw hole being formed only in each said first engager so as to not pass through said engaging plate, each said second engager having engaging pieces; and
- a plurality of receivers formed in said speaker frame so as to engage said first engagers, wherein each said engaging piece is elastically passed deformed when passing through a fixed hole in said attaching plate and is elastically restored after passing through the fixed hole so as to clamp the attaching plate to the speaker frame.

2. The speaker attaching construction according to claim 1, where each said fixture is secured on the speaker frame by tightening a screw in the screw hole formed in each said first engager.

3. The speaker attaching construction according to claim 1, wherein at least one of the fixing points is arranged close to a lower end of the speaker frame, and wherein water intruding between the speaker frame and the attaching plate is to be drained outward of the attaching plate through an internal space of the fixture close to the lower end.

4. The speaker attachment construction according to claim 1, further comprising an adapter arranged between the attaching plate and the speaker frame.

5. The speaker attaching construction according to claim 1, wherein each said engaging piece has a first slant that is slanted in a spreading manner, a second slat slant that is slanted in a reducing manner from the top end of the first slant, and a top end face extending horizontally from the top end of the second slant.

* * * * *